United States Patent [19]

Roberts et al.

[11] Patent Number: 4,753,851

[45] Date of Patent: Jun. 28, 1988

[54] MULTIPLE LAYER, TUNGSTEN/TITANIUM/TITANIUM NITRIDE ADHESION/DIFFUSION BARRIER LAYER STRUCTURE FOR GOLD-BASE MICROCIRCUIT INTERCONNECTION

[75] Inventors: Bruce E. Roberts; Charles M. Dalton, both of Palm Bay, Fla.; Jimmy C. Black, Durham, N.C.

[73] Assignee: Harris, Melbourne, Fla.

[21] Appl. No.: 55,356

[22] Filed: May 29, 1987

[51] Int. Cl.[4] .............................................. B32B 15/04
[52] U.S. Cl. .................................... 428/627; 428/620; 428/628; 428/641; 428/660; 428/665; 428/672; 204/192.17; 427/123; 357/71; 437/246
[58] Field of Search ............... 428/620, 627, 628, 641, 428/660, 665, 672; 204/192.15, 192.17, 192.25; 427/123, 125; 437/246; 357/67, 71

[56] References Cited

U.S. PATENT DOCUMENTS

| | | | |
|---|---|---|---|
| 4,226,082 | 10/1980 | Nishida | 428/627 |
| 4,403,014 | 9/1983 | Bergmann | 428/621 |
| 4,702,967 | 10/1987 | Black et al. | 428/620 |

OTHER PUBLICATIONS

Nelson, C. W., "Metallization and Glassing of Silicon Integrated Circuits," presented at 1969 International Society for Microelectronics Symposium, Oct. 1, 1969.

*Primary Examiner*—L. Dewayne Rutledge
*Assistant Examiner*—George Wyszomierski
*Attorney, Agent, or Firm*—Antonelli, Terry & Wands

[57] ABSTRACT

The inability of conventional adhesion/diffusion barrier Ti-TiN laminates to secure a narrow linewidth electrodeposited gold layer to a silicon structure and prevent unwanted gold diffusion during anneal cycles at temperatures greater than 370° C. for substantial periods of time is overcome by the addition of a medium thickness ($\geq 1,500$Å) layer of tungsten over the exposed silicon prior to formation of the titanium/titanium nitride laminate structure.

17 Claims, 1 Drawing Sheet

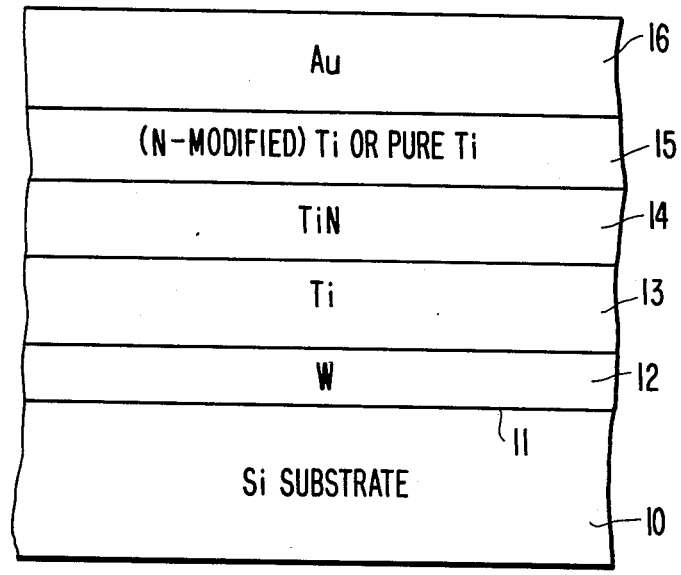

MULTIPLE LAYER, TUNGSTEN/TITANIUM/TITANIUM NITRIDE ADHESION/DIFFUSION BARRIER LAYER STRUCTURE FOR GOLD-BASE MICROCIRCUIT INTERCONNECTION

FIELD OF THE INVENTION

The present invention relates, in general, to semiconductor devices and is particularly directed to a laminate structure for adhering a gold interconnect layer to an underlying silicon substrate through the use of a multiple tungsten, titanium, titanium nitride adhesion/diffusion barrier structure.

BACKGROUND OF THE INVENTION

As microelectronics technology continues to refine integrated circuit structures of reduced minimum feature size, high integration density and signal processing speed, the flexibility of semiconductor wafer structure parameters has been reduced to the point where nearly all components have become constituent and dimensioned-critical. As an example, in semiconductor environments where signal processing speed and robustness against environmental threats are important performance criteria, such as in very high speed integrated circuits, electroplated gold, which possesses superior conductivity and external influence immunity properties, has become the predominate choice at the interconnect medium.

The use of gold electroplate, however, is not without a price, as gold does not readily adhere to semiconductor (e.g. silicon) wafer structures and, consequently, requires the use of an adhesion layer such as titanium between the gold and the underlying semiconductor material. As a further complication, when deposited directly upon a titanium layer, gold forms compounds that cannot be readily etched.

One approach for remedying this problem of formation of detrimental metal compounds has been the addition of a diffusion barrier of titanium nitride between the gold electroplate and the underlying titanium layer, with an additional barrier layer of platinum between the titanium nitride and the gold, as described in the U.S. patent to Fournier U.S. Pat. No. 3,879,746. In the environment to which the patented scheme is applied, the interconnect methodology involves beam lead structures in which the contact surface area of the interconnect metal and the photoresist used for its patterning is considerably larger and, therefore, less prone to delamination during plating, than the extremely narrow (submicron) line widths of present day integrated circuit structures.

Substitution of the platinum layer by a gold layer reduces the photoresist adhesion problem but introduces a loss of adhesion between the titanium nitride and the gold layers. It has been found that the titanium nitride layer, as employed in the patented laminate structure, does not possess the necessary adhesion strength to prevent a very narrow width noble metal layer from separating from the nitride layer when subjected to successive temperature cycles. While the adhesion mechanism is not completely understood, it is believed that the fact that the electroplated gold is tensile while the titanium nitride is compressive, together with the extremely narrow (quasi edge) contact area of the noble metal and the nitride, contributes to the tendency of the gold line to separate or peel away from the titanium nitride when subjected to repeated temperature cycling.

In the course of our investigation of the problems of laminate adhesion and detrimental metal compound formation (silicon and gold have a 370° C. eutectic temperature with a favorable free energy of formation and are therefore impacted by the 450° C. temperature at which radiation damage anneals are routinely performed), we have confirmed that a reasonable thickness of stoichiometric titanium mononitride between the titanium and the overlying gold will prevent gold from diffusing into the underlying silicon areas when the structure is subjected to the above mentioned anneal for periods up to 30 minutes. In this investigation, no platinum layer as proposed in the above-referenced patent to Fournier was included.

However, adhesion of the gold to the titanium nitride remains a significant problem.

Our investigation has revealed that the addition of a thin ($\leq 500$ Å) layer of titanium between the titanium nitride and the overlying gold will improve the adhesion to over twice minimum standards required; however, the same titanium nitride barrier that had been previously impervious to gold diffusion now exhibits scattered failure sites. This effective porosity of the titanium nitride to gold can be eliminated by increasing the thickness of the titanium nitride by 40%; unfortunately, the difficulty in etching the resulting compounds formed between the gold and the titanium increases.

SUMMARY OF THE INVENTION

In accordance with the present invention, the inability of conventional adhesion/diffusion barrier Ti-TiN laminates to securely maintain a narrow line width electrodeposited layer of gold to an underlying silicon structure and prevent unwanted gold diffusion during anneal cycles at temperatures greater than 370° C. (e.g. 450° C.) for substantial periods of time (greater than 30 minutes) is overcome by the addition of a medium thickness ($\geq 1,500$ Å) layer of tungsten over the exposed silicon prior to formation of the titanium/titanium nitride laminate structure. Through the addition of the tungsten layer, the thickness of the titanium nitride barrier may be reduced without loss of integrity.

In accordance with a preferred embodiment of the invention, the laminate structure is formed within a hybrid sputter/deposition system, having an RF power source and titanium and gold targets, plus carrier and nitrogen gas inlets for successively depositing titanium, titanium nitride, titanium and gold laminate structure atop a silicon semiconductor wafer. (Rather than employ a sputter deposition system, an activated reactive evaporation system may be employed.) With currently available commercial equipment, the tungsten may be deposited in another system before a sputtr system is employed for the remainder. In the course of the formation of the multilayer structure, a layer of tungsten is formed on all areas of exposed silicon. The tungsten may be deposited by chemical vapor deposition or plasma vapor deposition either selectively or nonselectively, as long as subsequent processing yields a thickness of at least 1,500 Å on all exposed silicon regions and leaves silicon dioxide regions uncoated. A layer of titanium is then formed on the surface of the tungsten layer by directing an argon sputtering gas at the titanium target at a reduced pressure. During this step and all subsequent steps, the sputtering process is carried out at a prescribed RF diode power for an RF field between the target and substrate.

After deposition of the titanium layer, nitrogen gas is controllably introduced into the system and a layer of titanium nitride is formed atop the titanium layer. The nitrogen source is then ramped down and the system allowed to stabilize. Titanium (possibly somewhat nitrogen-modified) is once again sputtered onto the laminate structure (specifically, the titanium nitride layer) to a thickness on the order of 400 Å. Thereafter, a gold seed layer is then sputter-formed atop the thin titanium layer.

BRIEF DESCRIPTION OF THE DRAWINGS

The single FIGURE is a diagrammatic cross-sectional illustration of a multiple tungsten/titanium/-titanium nitride/titanium adhesion/diffusion barrier layer structure for a gold-base interconnect atop a silicon wafer in accordance with the present invention.

DETAILED DESCRIPTION

Referring now to the single FIGURE, there is shown the laminate configuration of a multi-layer tungsten/-titanium/titanium nitride/titanium/gold structure atop a silicon semiconductor substrate on which a gold interconnect pattern is to be electroformed. In the explanation to follow the sequence of steps for producing the structure shown in the FIGURE will be described in detail.

The base layer upon which the multi-layer tungsten/-titanium/titanium nitride/titanium (or nitrogen-modified titanium)/gold layer is to be formed is a silicon substrate having a top surface 11. As pointed out previously, the improvement provided by the present invention involves the use of a tungsten barrier layer interposed between the titanium/titanium nitride laminate structure and the underlying silicon substrate, the tungsten barrier layer effectively masking or blocking the chemical potential between the silicon of the substrate and the overlying gold and thereby denying to the gold sufficient impetus to breach the titanium nitride of the multilaminate structure.

Formation of the tungsten layer 12 involves the insertion of the substrate 10 into an initial first deposition system, such as an Anicon or Genus system through which the tungsten may be deposited by chemical vapor deposition (or physical vapor deposition by sputtering) either selectively or nonselectively onto the silicon substrate. Where the silicon substrate contains an overlying layer of silicon dioxide, tungsten may be selectively deposited on the silicon only, by introducing tungsten hexafluoride ($WF_6$) gas and hydrogen gas at 100-500 milli Torr, 250°-330° C., $H_2/WF_6=3,000-10$ for a period of time sufficient to deposit a layer of tungsten 12 on the exposed surface 11 of silicon substrate 10 to a thickness of at least 1,500 Å and preferably in a range of 2,500 to 5,000 Å.

After formation of the initial tungsten barrier layer, the tungsten deposited substrate is removed from the first system and inserted into a suitable RF sputter deposition system, such as a Perkin Elmer 4400 series system. Respective titanium and gold targets are disposed at target sites within the system chamber such that the targets are in close proximity to the substrate, (preferably in a range of from two to three inches target-to-substrate separation). A suitable carrier gas (e.g. argon) supply line is coupled to one of the controlled gas inlets of the system while a nitrogen gas supply line is coupled to a second controlled gas inlet.

Formation of the multiple layer titanitium/titanium nitride-containing laminate structure atop the tungsten layer 12 is initiated by reducing the pressure within the system to a vacuum less than a value on the order of $4 \times 10^{-7}$ Torr A suitable sputter gas (argon) at a partial pressure of $4 \times 10^{-3}$ to $10^{-2}$ Torr is directed at the titanium target, and a titanium layer 13 is thereby deposited on the tungsten surface of the tungsten-coated substrate, which has been heated to a temperature on the order of 350° C. During this and all subsequent sputtering steps, the sputtering process is conducted in an RF field at a power preferably greater than 2 Kw.

After sputtering the titanium layer 13 to the desired thickness (preferably greater than 100 Å), on the tungsten layer 12, a layer of titanium nitride 14 is sputter-deposited at the above set of processing conditions, together with the introduction of nitrogen at a partial pressure equal to or greater than $2.5 \times 10^{-4}$ Torr. The thickness of the titanium nitride layer is preferably greater than a value on the order of 1,000 Å. During the formation of titanium nitride layer 14, the partial pressure of nitrogen gas is controlled so as to be preferably greater than $2.5 \times 10^{-4}$ Torr.

Upon completion of the deposition of titanium nitride layer 14, the flow of nitrogen is terminated (or substantially reduced) and the system is allowed to stabilize. Next, a layer of titanium, per se, or a layer of nitrogen-modified titanium, such as described in copending application Ser. No. 874,393 filed June 16, 1986 entitled "Multiple-Layer, Multiple-Phase Titanium/Nitrogen Adhesion/Diffusion Barrier Layer Structure for Gold-Based Microcircuit Interconnection", by J. C. Black et al and assigned to the Assignee of the present application, is formed.

Where the composition of layer 15 is titanium only, the same processing conditions for forming the initial layer 13 of titanium described are employed, so as to form a layer of titanium 15 to a thickness preferably greater than 100 Å and in preferred range of 100 to 300 Å.

Where layer 15 is formed by the process described in the above copending application, it is a nitrogen-modified layer containing sufficient nitrogen to effectively tie-up more than 10% of the available atomic titanium orbitals and thereby greatly inhibiting the titanium from reacting with the gold and forming unetchable gold-titanium compounds. As described in that application, this "stuffed barrier" layer may be formed by resuming sputtering from the titanium target in a nitrogen partial pressure less than $2.5 \times 10^{-4}$ and preferably in a range of $9.5 \times 10^{-5}$ to $1.6 \times 10^{-4}$ Torr, so that a thin nitrogen-modified film of titanium 15 is formed atop the titanium nitride layer 14. As explained in the above-referenced copending application, it is preferred that the thickness of the nitrogen-modified titanium layer lie within a range between 100 Å and 400 Å in order to retain superior adhesion/barrier properties of the laminate structure when subjected to subsequent heat cycling. When formed as a nitrogen-modified titanium barrier layer, layer 15 contains a quantity of interstitial nitrogen in the titanium less than of a titanium nitride layer so that the nitrogen is not a complete barrier between the overlying gold to be formed atop the laminate structure and the titanium. Metallurgical analysis of such a nitrogen-modified film has revealed the above-referenced properties. If the thickness of the nitrogen-modified layer 15 is less than 100 Å, the film contains insufficient titanium coverage to provide the necessary adhesion with the overlying gold. If the thickness of film 15 exceeds 400 Å, the quantity of titanium becomes excessive, so that at elevated annealing temperatures and in the presence of oxygen, the titanium diffuses through to the surface of film 15 and both oxidizes and combines with the gold to form (detrimental) unetchable intermetallic compounds.

After film 15 (either a single titanium film or a nitrogen-modified titanium film) has been formed to a prescribed thickness atop titanium nitride layer 14, gold is sputtered (using the argon sputtering gas only) to form a seed gold layer 16. The thickness of gold layer 16 may lie in a range of from 500 Å to 1,000 Å. Of course, the thickness of gold layer 16 may be greater 1,000 Å; it is simply a consequence that if the gold becomes thicker it becomes more difficult to etch. Thus, the range given is preferred for integrated circuit applications. It is only after completion of the sputter-deposition of the gold layer 16 that the laminate structure is removed and exposed to air.

Temperature cycling of the resultant laminate structure atop a silicon substrate 10 to a temperature on the order of 450° C. for periods of up to 24 hours has been found to cause no instability in the laminate structure. Auger analysis has revealed the absence of any silicon movement up through the layer of tungsten.

While we have shown and described an embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. A multiple layer structure for adhering gold to an underlying substrate comprising:
    a layer of tungsten overlying said substrate;
    a multilayer laminate of titanium and titanium nitride layers overlying said layer of tungsten; and
    a gold layer overlying said multilayer laminate.

2. A multiple layer structure according to claim 1, wherein said substrate comprises silicon.

3. A multiple layer structure according to claim 2, wherein the thickness of said layer of tungsten is at least 1,500 Å.

4. A multiple layer structure according to claim 1, wherein said multilayer laminate comprises
    a first layer of titanium overlying said layer of tungsten, a second layer of titanium nitride overlying said first layer, and a third layer of titanium overlying said second layer.

5. A multiple layer structure according to claim 1, wherein said multilayer laminate comprises
    a first layer of titanium overlying said layer of tungsten, a second layer of titanium nitride overlying said first layer, and a third layer of nitrogen-modified titanium overlying said second layer and being of a thickness large enough to provide sufficient titanium for adherence with said gold layer but less than that which would cause titanium-gold compounds to be formed on the surface of said gold layer as a result of subsequent heating.

6. A multiple layer structure according to claim 5, wherein the thickness of said third layer of nitrogen-modified titanium lies on a range of from 100 Å to 400 Å.

7. A multiple layer structure according to claim 6, wherein the bulk of said third layer of nitrogen-modified titanium is characterized by the absence of a nitride compound of titanium, but contains nitrogen interstitially distributed in the titanium of said third layer.

8. A multiple layer structure according to claim 7, wherein the thickness of said first layer is greater than 100 Å and the thickness of said second layer is greater than 1,000 Å.

9. A multiple layer structure according to claim 5, wherein said substrate comprises silicon.

10. A multiple layer structure according to claim 9, wherein the thickness of said layer of tungsten is at least 1500 Å.

11. A method of adhering gold to an underlying substrate comprising the steps of:
    (a) forming a layer of tungsten on said substrate;
    (b) forming a multiple layer laminate of layers containing titanium and titanium nitride on said layer of tungsten; and
    (c) forming a gold layer on the multiple layer laminate formed in step (b).

12. A method according to claim 11, wherein said substrate contains silicon.

13. A method according to claim 12, wherein the thickness of said layer of tungsten is at least 1,500 Å.

14. A method according to claim 11, wherein step (b) comprises the steps of:
    (b-1) forming a layer of titanium on said tungsten layer;
    (b-2) forming a layer of titanium nitride on said layer of titanium; and
    (b-3) forming a layer of titanium on said layer of titanium nitride.

15. A method according to claim 11, wherein step (b) comprises the steps of:
    (b-1) forming a layer of titanium on said tungsten layer;
    (b-2) forming a layer of titanium nitride on said layer of titanium; and
    (b-3) forming a layer of nitrogen-modified titanium on said layer of titanium nitride, said layer of nitrogen-modified titanium having a thickness large enough to provide sufficient titanium for adherence with said gold layer but less than that which would cause titanium-gold compounds to be formed on the surface of said overlying gold layer as a result of subsequent heating.

16. A method according to claim 15, wherein step (b-3) comprises depositing titanium on said layer of titanium nitride while introducing nitrogen into the deposited titanium such that the bulk of the layer of nitrogen-modified titanium is absent a nitride compound of titanium, but contains interstitially distributed in the deposited titanium.

17. A method according to claim 16, wherein the thickness of said layer of nitrogen-modified titanium lies in a range of from 100 Å to 400 Å.

* * * * *